(12) United States Patent
Hong et al.

(10) Patent No.: US 12,729,423 B2
(45) Date of Patent: Sep. 8, 2026

(54) FILM FORMING METHOD, FILM FORMING DEVICE, AND METHOD FOR MANUFACTURING SEMICONDUCTOR DEVICE

(71) Applicant: Tokyo Electron Limited, Tokyo (JP)

(72) Inventors: Seokhyoung Hong, Nirasaki City (JP); Tsuyoshi Takahashi, Nirasaki City (JP); Taichi Monden, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 764 days.

(21) Appl. No.: 17/758,819

(22) PCT Filed: Nov. 30, 2020

(86) PCT No.: PCT/JP2020/044478
§ 371 (c)(1),
(2) Date: Jul. 14, 2022

(87) PCT Pub. No.: WO2021/145077
PCT Pub. Date: Jul. 22, 2021

(65) Prior Publication Data

US 2023/0037960 A1 Feb. 9, 2023

(30) Foreign Application Priority Data

Jan. 15, 2020 (JP) ................................ 2020-004161
Aug. 11, 2020 (JP) ................................ 2020-135695

(51) Int. Cl.
*C23C 14/06* (2006.01)
*C23C 14/18* (2006.01)
(Continued)

(52) U.S. Cl.
CPC .......... *C23C 14/0641* (2013.01); *C23C 14/18* (2013.01); *C23C 14/5846* (2013.01);
(Continued)

(58) Field of Classification Search
CPC ..... C23C 14/0641; C23C 14/16; C23C 14/18; C23C 14/5846; C23C 16/06; C23C 16/34;
(Continued)

(56) References Cited

U.S. PATENT DOCUMENTS 6,933,021 B2 * 8/2005 Chou ................ H01L 21/76862
257/E21.162
7,833,906 B2 * 11/2010 Knapp ............. H01L 21/76862
438/785

(Continued)

FOREIGN PATENT DOCUMENTS

CN 104651806 A 5/2015
CN 109423625 A 3/2019

(Continued)

*Primary Examiner* — Natalia A Gondarenko
(74) *Attorney, Agent, or Firm* — Armstrong Teasdale LLP

(57) ABSTRACT

A film forming method includes: providing the substrate into the processing container; forming a metal-based film on the substrate within the processing container; and subsequently, supplying a Si-containing gas into the processing container in a state in which the substrate is provided within the processing container.

15 Claims, 8 Drawing Sheets

(51) Int. Cl.

| | |
|---|---|
| ***C23C 14/58*** | (2006.01) |
| ***C23C 16/06*** | (2006.01) |
| ***C23C 16/34*** | (2006.01) |
| ***C23C 16/455*** | (2006.01) |
| ***C23C 16/56*** | (2006.01) |
| ***H10P 14/40*** | (2026.01) |
| ***H10P 95/00*** | (2026.01) |
| ***H10W 20/00*** | (2026.01) |

(52) U.S. Cl.

CPC .............. *C23C 16/06* (2013.01); *C23C 16/34* (2013.01); *C23C 16/45525* (2013.01); *C23C 16/56* (2013.01); *H10P 14/418* (2026.01); *H10P 95/00* (2026.01); *H10W 20/048* (2026.01)

(58) Field of Classification Search

CPC .............. C23C 16/45525; C23C 16/56; H01L 21/28568; H01L 21/321; H01L 21/76856; H01L 21/0217; H01L 21/0228; H01L 21/28562; H01L 21/76843; H01L 21/28; H01L 21/2855; H01L 21/28556; H01L 21/32051; H01L 21/76853; H10P 95/00; H10P 14/432; H10P 14/412; H10P 14/43; H10P 14/44; H10P 14/418; H10P 14/6339; H10P 14/69433; H10P 14/69475; H10P 14/694; H10P 14/603; H10P 14/6911; H10P 14/6348; H10P 14/6336; H10P 14/6328; H10D 64/011; H10W 20/032; H10W 20/033; H10W 20/048; H10W 20/042; H10W 20/0526

USPC ......................................... 438/680, 630, 648

See application file for complete search history.

(56) References Cited

U.S. PATENT DOCUMENTS

| | | | | |
|---|---|---|---|---|
| 2001/0029094 | A1* | 10/2001 | Mee-Young ...... H01L 21/76843 257/E21.585 | |
| 2003/0190497 | A1* | 10/2003 | Yang ................. C23C 16/45565 257/E21.171 | |
| 2004/0058510 | A1 | 3/2004 | Hyodo et al. | |
| 2006/0216928 | A1* | 9/2006 | Chung ............. C23C 16/45531 438/630 | |
| 2006/0276020 | A1* | 12/2006 | Yoon ................ H01L 21/28518 257/E21.171 | |
| 2013/0137262 | A1* | 5/2013 | Satoh ................ H01L 21/28556 438/685 | |
| 2015/0145154 | A1 | 5/2015 | Chandrasekharan et al. | |
| 2018/0347040 | A1 | 12/2018 | Vats et al. | |
| 2019/0067015 | A1 | 2/2019 | Wagatsuma et al. | |
| 2020/0181770 | A1* | 6/2020 | Longrie ................ C23C 16/345 | |

FOREIGN PATENT DOCUMENTS

| | | | |
|---|---|---|---|
| DE | 289156 | A5 | 4/1991 |
| JP | H10-144629 | A | 5/1998 |
| JP | 2015-078418 | A | 4/2015 |
| JP | 2017-183551 | A | 10/2017 |

* cited by examiner

FIG. 4
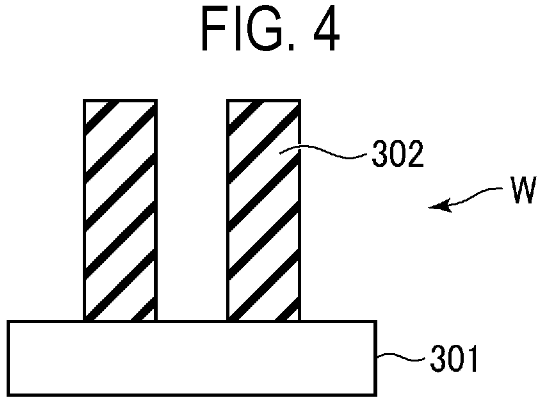
FIG. 5
303
302
W
301
FIG. 6
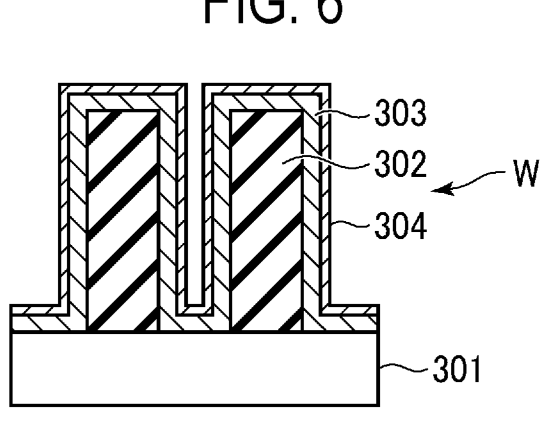

Film forming step

Si-containing gas supplying step $TiCl_4$ $NH_3$

DCS or $SiH_4$

Specific resistance [μΩ·cm]
450
400
350
300
250
200
150
100
50
0
0 2 4 6 8 10 12
Supply time of DCS gas [sec]
37.8% reduced 305
303
302
304
W
301

FILM FORMING METHOD, FILM FORMING DEVICE, AND METHOD FOR MANUFACTURING SEMICONDUCTOR DEVICE

CROSS-REFERENCE TO RELATED APPLICATIONS

The present application is a U.S. National Stage Entry of International Patent Application No. PCT/JP2020/044478, filed Nov. 30, 2020, which claims the benefit of priority to Japanese Patent Application Nos. 2020-004161, filed Jan. 15, 2020, and 2020-135695, filed Aug. 11, 2020, each of which is hereby incorporated herein by reference in its entirety.

TECHNICAL FIELD

The present disclosure relates to a film forming method, a film forming apparatus, and a semiconductor device manufacturing method.

BACKGROUND

In a semiconductor device manufacturing process, for example, a metal-based film such as a TiN film is used for various uses such as an electrode, such as a lower electrode of a DRAM, or a barrier film. A general thin film forming technique is used for forming a metal-based film such as a TiN film, and Patent Document 1 describes forming a TiN film by an atomic layer deposition method (ALD method).

PRIOR ART DOCUMENTS

Patent Document

Patent Document 1: Japanese laid-open publication No. 2015-78418

SUMMARY

The present disclosure provides a film forming method, a film forming apparatus, and a semiconductor device manufacturing method capable of suppressing oxidation of a film surface when forming a metal-based film.

A film forming method according to an aspect of the present disclosure includes: providing a substrate into the processing container; forming a metal-based film on the substrate within the processing container; and then supplying a Si-containing gas into the processing container in a state in which the substrate is provided within the processing container.

According to the present disclosure, a film forming method, a film forming apparatus, and a semiconductor device manufacturing method capable of suppressing oxidation of a film surface when forming a metal-based film are provided.

BRIEF DESCRIPTION OF DRAWINGS

FIG. 4 is a cross-sectional view illustrating a structural example of a semiconductor wafer on which a film forming process is performed by the apparatus of FIG. 3.

FIG. 5 is a cross-sectional view illustrating a state in which a TiN film is formed on the semiconductor wafer of FIG. 4.

FIG. 6 is a cross-sectional view illustrating a state in which a surface layer is formed on a surface of a TiN film by performing a step of supplying DCS gas, which is a Si-containing gas, into the chamber after the formation of the TiN film.

DETAILED DESCRIPTION

Hereinafter, embodiments will be described with reference to the accompanying drawings.

<Embodiment of Film Forming Method>

First, an embodiment of a film forming method will be described.

Figure 1:
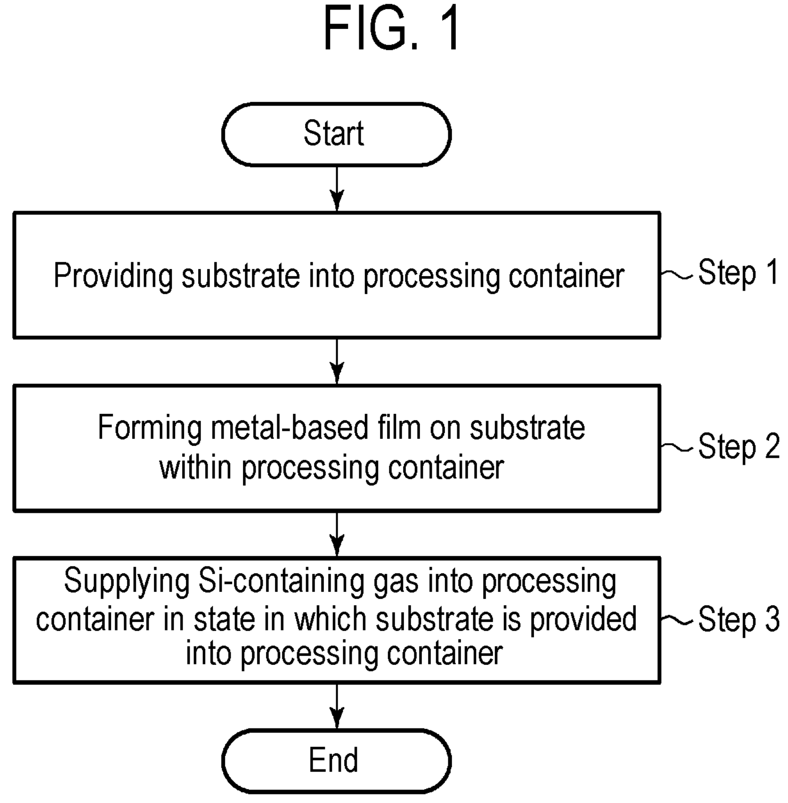
FIG. 1 a flowchart illustrating a film forming method according to an embodiment.
Figure 2A:
FIGS. 2A to 2C are cross-sectional views illustrating steps of the film forming method according to the embodiment.
Figure 2B:
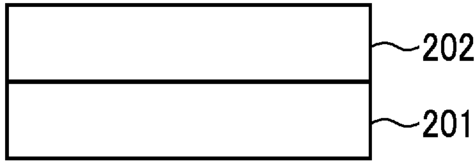
Figure 2C:
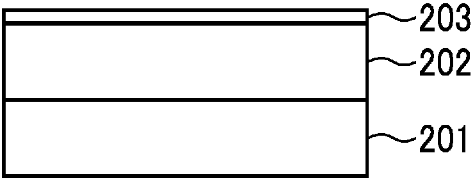

FIG. 1 is a flowchart illustrating a film forming method according to an embodiment and FIGS. 2A to 2C are sectional views of steps of the film forming method. As illustrated in FIG. 1 and FIGS. 2A to 2C, a film forming method according to the present embodiment includes: a step of providing a substrate 201 into a processing container of a film forming apparatus (step 1 in FIG. 2A); a step of forming a metal-based film 202 on the substrate 201 within the processing container (step 2 in FIG. 2B); and then a step of supplying a Si-containing gas into the processing container in a state in which the substrate 201 is provided into the processing container (step 3 in FIG. 2C).

In step 1, the substrate 201 on which a metal-based film is to be formed is disposed within the processing container of the film forming apparatus to prepare for film formation. The substrate 201 is not particularly limited, but a semiconductor substrate (a semiconductor wafer) including a semiconductor base body, such as silicon, is exemplified. The substrate 201 in this case may be the semiconductor base body itself, or may be a substrate in which one or more films having a desired function are formed on a semiconductor base body.

Examples of the metal-based film 202 formed on the substrate 201 in step 2 include a metal film and a metal compound film the characteristics of which may be deteriorated due to oxidation. Specific examples include a Ti film, a TiN film, a Ta film, a TaN film, a W film, an Al film, a Mo film, a Ru film, a Co film, and a Ni film.

The method of forming the metal-based film 202 is not particularly limited, and thin film forming techniques such as an ALD method, a CVD method, and a PVD method are exemplified. From the viewpoint of obtaining a good step coverage, the ALD method is desirable.

Step 3 is a post-film forming process in which a Si-containing gas is supplied into the processing container after the metal-based film 202 is formed. By supplying the Si-containing gas, the Si-containing gas is adsorbed on the surface of the metal-based film, and a surface layer 203 containing Si is formed.

Ammonia ($NH_3$), which is a reaction gas that reacts with another gas, for example, the Si-containing gas, or an inert gas may be supplied together with the Si-containing gas. The Si-containing gas is not particularly limited, but examples thereof include a silane-based compound, a chlorosilane-based compound, and an organic silane-based compound. Examples of the silane-based compound include silane (monosilane) and disilane. Examples of the chlorosilane-based compound include dichlorosilane, monochlorosilane, trichlorosilane, silicontetrachloride, and hexachlorodisilane. Examples of the organic silane-based compound include aminosilane-based compounds such as butylaminosilane, bis tertiary butylaminosilane, and dimethylaminosilane. Among these, at least one of dichlorosilane, silane, and disilane, which are generally used in a semiconductor manufacturing process, may be preferably used.

When only a Si-containing gas or a Si-containing gas and an inert gas are supplied, the Si-containing gas may be thermally decomposed to form a Si layer as the surface layer 203. The surface layer 203 may have a reaction layer in which Si and a base have reacted with each other. When the reaction gas is supplied in addition to the Si-containing gas, a Si compound layer may be formed as the surface layer 203 by the reaction between the Si-containing gas and the reaction gas. For example, when a nitrogen-containing gas such as $NH_3$ gas is used as the reaction gas, a SiN layer may be formed as the surface layer 203.

The temperature and pressure conditions in the step of supplying the Si-containing gas in step 3 differ slightly depending on the Si-containing gas to be used, but the temperature is preferably in the range of 400 to 700 degrees C., and the pressure is preferably in the range of 266.6 to 13,332.2 Pa (2 to 100 Torr).

The supply of Si-containing gas may be performed once or repeated multiple times. When the supply of the Si-containing gas is performed once, it is possible to control the adsorption amount by the supply time. In this case, the supply time of the Si-containing gas is preferably 0.05 to 20 sec. In addition, by repeating the supply of the Si-containing gas multiple times, it is possible to control the adsorption amount of the Si-containing gas by the number of times, and to improve the controllability of the layer thickness of the surface layer 203. In this case, the supply time of the Si-containing gas at one time is preferably 0.05 to 4 sec, and the number of times (the number of cycles) of supplying the Si-containing gas is preferably in the range of 1 to 5 times. In addition, it is preferable to perform purging with an inert gas between the cycles of supplying the Si-containing gas.

When a reaction gas is supplied in addition to the Si-containing gas, the reaction gas may be supplied after the Si-containing gas is supplied, or the Si-containing gas and the reaction gas may be alternately supplied multiple times. By alternately supplying the Si-containing gas and the reaction gas multiple times, it is possible to form a Si compound layer as the surface layer 203 with good layer thickness controllability. The Si-containing gas and the reaction gas may be supplied at the same time. By using, for example, $NH_3$ gas as the reaction gas, it is possible to form a SiN layer as the surface layer 203.

When the surface layer 203 is formed by supplying the Si-containing gas, the adsorption amount of the Si-containing gas is not particularly limited, and the effect of suppressing oxidation is obtained with one or more molecular layers. When the adsorption amount of the Si-containing gas becomes too large, there is concern about the influence on the characteristics. Therefore, the adsorption amount is preferably 15 nm or less in terms of film thickness, and the thickness of the surface layer 203 is preferably in the range of 0.5 to 1 nm. Similarly, when the Si-containing gas and the reaction gas are supplied to form a Si compound layer such as a SiN layer as the surface layer 203, the thickness of the surface layer 203 is preferably in the range of 0.5 to 1 nm.

The reason for performing the step of supplying the Si-containing gas after forming the metal-based film in this way will be described below.

After the metal-based film is formed, the substrate is carried out from the processing container and provided for the next step. When the substrate is carried out into the atmosphere before the next step, the formed metal-based film is oxidized from the surface in a bulk direction by being exposed to oxygen or moisture in the atmosphere, and thus a characteristic thereof is deteriorated. For example, the resistance of the film increases. In particular, when the film thickness is thin, the influence of oxidation from the surface becomes large, and thus the characteristic deterioration becomes remarkable.

Therefore, after forming the metal-based film 202 on the substrate 201 within the processing container, the surface layer 203 is formed by supplying the Si-containing gas into the processing container such that the Si-containing gas is adsorbed on the surface of the metal-based film 202. As a result, since the substrate is carried out in a state in which the surface of the metal-based film 202 is not exposed, oxidation of the metal-based film 202 is suppressed.

The next step may be performed in another processing container of the vacuum system. However, even in that case, since the metal-based film is slightly oxidized by oxygen or moisture in a vacuum transport system, the effect of suppressing oxidation by the step of supplying the Si-containing gas is exhibited.

Since the surface layer 203 is formed when the Si-containing gas adsorbed on the surface of the metal-based film 202 is heated, the surface layer 203 may have a reaction layer due to the reaction between the adsorbed Si-containing gas and the surface of the metal-based film.

As described above, as the film thickness is thinner, the effect of oxidation of the metal-based film is greater, and characteristic deterioration, such as increased resistance, appears remarkably. Therefore, when the film thickness of the metal-based film is 5 nm or less, the effect of suppressing oxidation by the Si-containing gas is greater.

After the step of supplying the Si-containing gas, the substrate is carried out from the processing container, and the next film forming step is performed by another film forming apparatus. At this time, since the surface layer containing Si is formed on the surface of the metal-based film on the substrate, if the next film forming step is a step of forming a Si-containing film, the affinity is improved. At this time, since Si is present on the surface on which the Si-containing film is formed, a good effect such as shortening the incubation time when forming the Si-containing film can be obtained.

<Application to Formation of TiN Film>

Next, formation of a TiN film will be described as a specific application example.

A TiN film as a metal-based film is used as a barrier film or an electrode, and is required to have a low electrical resistance. For the formation of a TiN film, an ALD method, which is capable of obtaining a film of good film quality with a high step coverage, is often used. After the TiN film is formed, the next step of a film forming process, for example, a formation of a SiGe film, is performed. In that case, since both film formations are performed in different apparatuses, after the TiN film is formed, the substrate is carried out into the atmosphere. At this time, there arises a problem in that it is difficult to obtain good device characteristics because the TiN film is oxidized by moisture or oxygen in the atmosphere and the thus resistance is increased. Therefore, a step of supplying a Si-containing gas is performed to form a surface layer on the surface of the TiN film so as to suppress the oxidation of the TiN film after the substrate is carried out from the processing container.

The details will be described below.

[Film Forming Apparatus for TiN Film]

Figure 3:
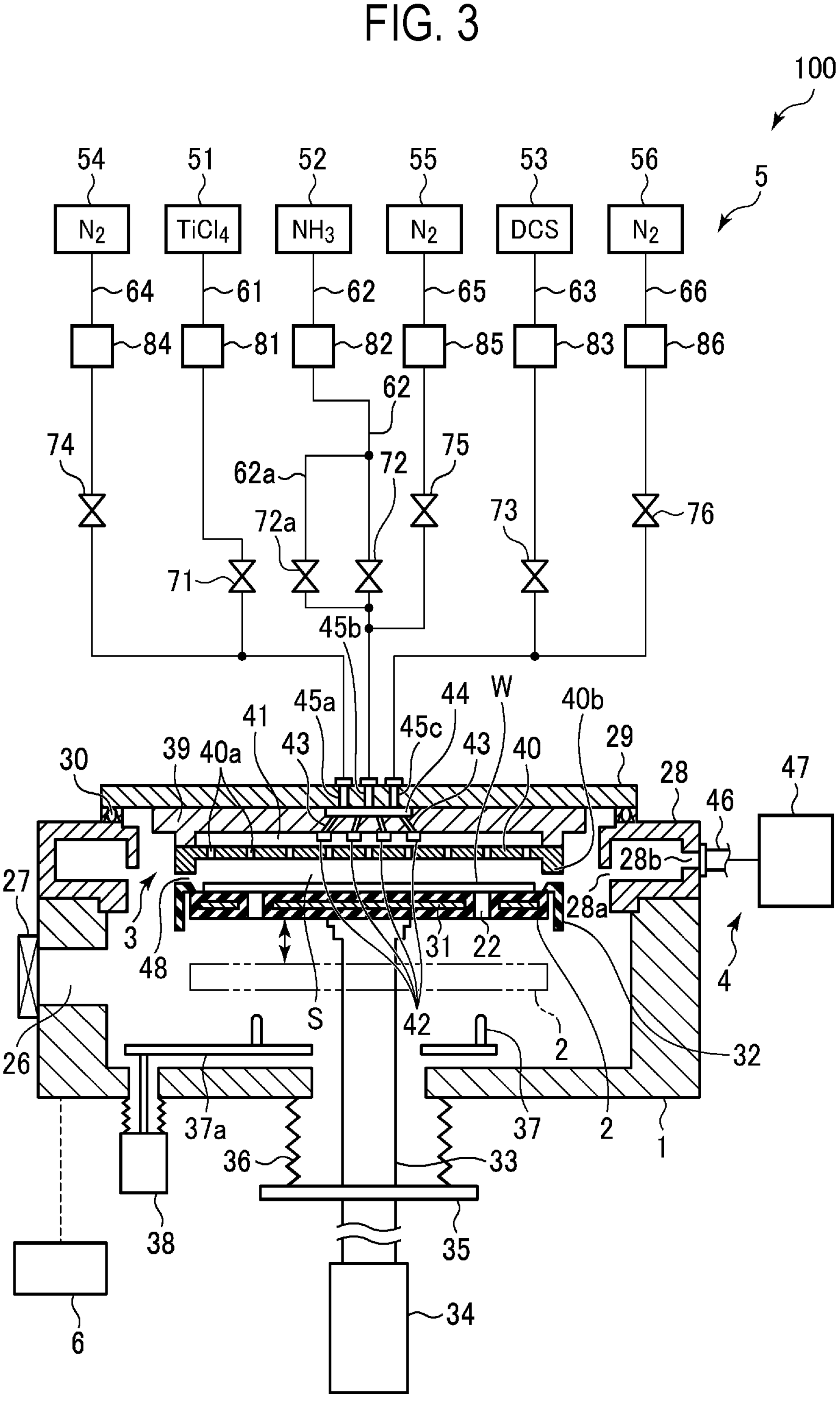
FIG. 3 is a cross-sectional view illustrating an example of a film forming apparatus when a film forming method of an embodiment is applied to the formation of a TiN film.

FIG. 3 is a cross-sectional view illustrating an example of a film forming apparatus when a film forming method of an embodiment is applied to the formation of a TiN film.

The film forming apparatus 100 includes a chamber 1 as a processing container, a susceptor (a substrate placement stage) 2, a shower head 3, an exhaust part 4, a gas supply mechanism 5, and a controller 6.

The chamber 1 is made of a metal such as aluminum, and has a substantially cylindrical shape. A carry-in/out port 26 through which a semiconductor wafer (hereinafter, simply referred to as a wafer) W, which is a substrate, is carried in/out with respect to a vacuum transport chamber (not illustrated) by a transport mechanism (not illustrated), is formed in the side wall of the chamber 1, and the carry-in/out port 26 is configured to be openable/closable by a gate valve 27. An annular exhaust duct 28 having a rectangular cross section is provided on the main body of the chamber 1. A slit 28*a* is formed along the inner peripheral surface of the exhaust duct 28. In addition, an exhaust port 28*b* is formed in the outer wall of the exhaust duct 28. On the top surface of the exhaust duct 28, a ceiling wall 29 is provided to close the upper opening of the chamber 1. The space between the ceiling wall 29 and the exhaust duct 28 is hermetically sealed with a seal ring 30.

The susceptor 2 is configured to place thereon a wafer W, which is a substrate, within the chamber 1, has a disk shape having a size corresponding to the wafer W, and is provided horizontally. The susceptor 2 is supported on a support member 33. A heater 31 for heating the wafer W is embedded in the susceptor 2. The heater 31 is supplied with power from a heater power supply (not illustrated) to generate heat. Then, by controlling the output of the heater 31, the wafer W is controlled to a predetermined temperature. The susceptor 2 is provided with a ceramic cover member 32 to cover the outer peripheral region of the wafer placement surface and the side surface of the susceptor.

The support member 33, which supports the susceptor 2, extends from the center of the bottom surface of the susceptor 2 through a hole formed in the bottom wall of the chamber 1 to the lower side of the chamber 1, and the lower end of the support member 33 is connected to a lifting mechanism 34. The susceptor 2 is configured to be raised and lowered between a processing position illustrated in FIG. 3 and a transport position at which wafer can be transported by the lifting mechanism 34 via the support member 33. The transport position is indicated by an alternating long and two short dashes line. In addition, a flange 35 is provided on the support member 33 below the chamber 1, and a bellows 36, which partitions the atmosphere within the chamber 1 from the ambient air, is provided between the bottom surface of the chamber 1 and the flange 35 to expand and contract in response to the raised and lowered operation of the susceptor 2.

Three wafer support pins 37 (of which only two are illustrated) are provided in the vicinity of the bottom surface of the chamber 1 to protrude upward from a lifting plate 37*a*. The wafer support pins 37 are configured to be raised and lowered via the lifting plate 37*a* by the lifting mechanism 38 provided below the chamber 1, and are inserted through through-holes 22 provided in the susceptor 2 located at the transport position to be movable upward or downward with respect to the top surface of the susceptor 2. This causes delivery of a wafer W to be performed between the wafer transport mechanism (not illustrated) and the susceptor 2.

The shower head 3 is configured to supply a processing gas into the chamber 1 in the form of a shower, and is provided in the upper portion of the chamber 1 to face the susceptor 2 and has substantially the same diameter as the susceptor 2. The shower head 3 includes a main body 39 fixed to the ceiling wall 29 of the chamber 1 and a shower plate 40 connected to the lower side of the main body 39. A gas diffusion space 41 is formed between the main body 39 and the shower plate 40.

In the gas diffusion space 41, a plurality of gas diffusion members 42 are provided. A plurality of gas discharge holes are formed around the gas diffusion members 42. The gas diffusion members 42 are connected, respectively, to one ends of a plurality of gas supply paths 43, which are provided in the main body 39. The other ends of the gas supply paths 43 are connected to a diffusion part 44 formed in the central portion of the top surface of the main body 39. In the central portion of the main body 39, three gas introduction holes 45*a*, 45*b*, and 45*c* penetrating the main body 39 from the top surface thereof to the diffusion part 44 are provided.

An annular protrusion 40*b* protruding downward is formed at the peripheral edge of the shower plate 40, and gas ejection holes 40*a* are formed in the flat surface inside the annular protrusion 40*b* of the shower plate 40. In the state in which the susceptor 2 is located at the processing position, a processing space S is formed between the shower plate 40 and the susceptor 22, and the annular protrusion 40*b* and the top surface of the cover member 32 of the susceptor 2 are located close to each other to form an annular gap 48 therebetween.

The exhaust part 4 includes: an exhaust pipe 46 connected to the exhaust port 28*b* in the exhaust duct 28; and an exhaust mechanism 47 connected to the exhaust pipe 46 and including a vacuum pump, a pressure control valve, or the like. During processing, the gas within the chamber 1 reaches the exhaust duct 28 via the slit 28*a*, and is exhausted from the exhaust duct 28 through the exhaust pipe 46 by the exhaust mechanism 47 of the exhaust part 4.

The processing gas supply mechanism 5 includes a $TiCl_4$ gas source 51, an $NH_3$ gas source 52, a dichlorosilane (DCS) gas source 53, a first $N_2$ gas source 54, a second $N_2$ gas source 55, and a third $N_2$ gas source 56. The $TiCl_4$ gas source 51 supplies $TiCl_4$ gas, which is a Ti raw material gas. The $NH_3$ gas source 52 supplies $NH_3$ gas, which is a nitride gas (reducing gas). The DCS gas source 53 supplies DCS gas, which is a Si-containing gas. The first to third $N_2$ gas sources 54, 55, and 56 supply $N_2$ gas as a carrier gas and a purge gas. The carrier gas and the purge gas are not limited to the $N_2$ gas, and other inert gases such as Ar gas may be used.

One end of a $TiCl_4$ gas supply pipe 61 is connected to the $TiCl_4$ gas source 51. One end of an $NH_3$ gas supply pipe 62 is connected to the $NH_3$ gas source 52. One end of a DCS supply pipe 63 is connected to the DCS gas source 53. One end of a first $N_2$ gas supply pipe 64, a second $N_2$ gas supply pipe 65, and a third $N_2$ gas supply pipe 66 are connected to the first $N_2$ gas source 54, the second $N_2$ gas source 55, and the third $N_2$ gas source 56, respectively. The other end of the $TiCl_4$ gas supply pipe 61 is connected to the gas introduction hole 45*a*, the other end of the $NH_3$ gas supply pipe 62 is connected to the gas introduction hole 45*b*, and the other end of the DCS gas supply pipe 63 is connected to the gas introduction hole 45*c*. The other end of the first $N_2$ gas supply pipe 64 is connected to the $TiCl_4$ gas supply pipe 61, the other end of the second $N_2$ gas supply pipe 65 is connected to the $NH_3$ gas supply pipe 62, and the other end of the third $N_2$ gas supply pipe 66 is connected to the DCS gas supply pipe 63. A branch pipe 62*a* is branched in the middle of the $NH_3$ gas supply pipe 62, and the other end of the branch pipe 62*a* joins the $NH_3$ gas supply pipe 62. By providing the branch pipe 62*a* in this way, it is possible to supply a large flow rate of $NH_3$ gas. The $TiCl_4$ gas supply pipe 61, the $NH_3$ gas supply pipe 62, the branch pipe 62*a*, and the DCS gas supply pipe 63 are provided with opening/closing valves 71, 72, 72*a*, and 73 at the upstream sides of the joining portions of the $N_2$ gas supply pipes, respectively. In addition, the first $N_2$ gas supply pipe 64, the second $N_2$ gas supply pipe 65, and the third $N_2$ gas pipe 66 are provided with opening/closing valves 74, 75, and 76, respectively. In addition, the $TiCl_4$ gas supply pipe 61, the $NH_3$ gas supply pipe 62, the DCS gas supply pipe 63, the first $N_2$ gas supply pipe 64, the second $N_2$ gas supply pipe 65, and third $N_2$ gas pipe 66 are provided with flow rate controllers 81 to 86 at the upstream sides of the opening/closing valves thereof, respectively. As the flow rate controllers, for example, mass flow controllers may be used.

When a TiN film is formed, ALD film formation may be performed by constantly opening the opening/closing valves 74, 75, and 76 of the first $N_2$ gas supply pipe 64, the second $N_2$ gas supply pipe 65, and the third $N_2$ gas supply pipe 66 to constantly supply $N_2$ gas and operating the opening/closing valves 71, 72, and 72*a* at a high speed in the state in which the opening/closing valve 73 is closed. When supplying a DCS gas, which is a Si-containing gas, the valves 71, 72, 72*a* are closed and the opening/closing valve 73 is opened after the film formation.

A pipe that branches from each of the first $N_2$ gas supply pipe 64, the second $N_2$ gas supply pipe 65, and the third $N_2$ gas supply pipe 66 to increase the flow rate of the $N_2$ gas only during purging may be provided to increase the flow rate of the $N_2$ gas during the purging step. In addition, the purge gas is not limited to $N_2$ gas, and may be another inert gas such as Ar gas.

As the Ti raw material gas, tetra(isopropoxy)titanium (TTIP), titanium tetrabromide ($TiBr_4$), titanium tetraiodide ($TiI_4$), tetrakis(ethylmethylamino)titanium (TEMAT), and tetrakis(dimethylamino)titanium (TDMAT), tetrakis(diethylamino)titanium (TDEAT), or the like may also be used, in addition to the $TiCl_4$. As the nitriding gas (reducing gas), a hydrazine-based gas, such as monomethylhydrazine (MMH), or the like may be used, in addition to the $NH_3$ gas. In addition, as the silicon-containing gas, various gases as described above may be used, in addition to the DCS gas.

The controller 6 is configured with a computer, and includes a main controller including a CPU, an input device (e.g., a keyboard, a mouse or the like), an output device (e.g., a printer or the like), a display device (e.g., a display or the like), and a storage device (a storage medium). The main controller controls the operations of respective components, such as opening/closing of the opening/closing valves 71 to 76, adjustment of gas flow rates via the flow rate controllers 81 to 86, adjustment of the pressure within the chamber 1 by a pressure control valve, and adjustment of the temperature of a wafer W by the heater 31. The control of these operations is executed by a processing recipe which is a control program stored in a storage medium (e.g., a hard disk, an optical disk, or a semiconductor memory) embedded in the storage device.

[Method of Forming TiN Film with Film Forming Apparatus of FIG. 3]

Next, a method for forming a TiN film in the film forming apparatus 100 configured as described above will be described.

First, the gate valve 27 is opened, and a wafer W is carried into the chamber 1 from the vacuum transport chamber by the transport apparatus and placed on the susceptor 2. As the wafer W, for example, as illustrated in FIG. 4, a wafer W having a patterned $SiO_2$ film 302 on a Si base body 301 is used.

After retracting the transport apparatus, the gate valve 27 is closed and the susceptor 2 is raised to the processing position. Next, $N_2$ gas is continuously supplied into the processing space S from the first $N_2$ gas source 54, the second $N_2$ gas source 55, and the third $N_2$ gas source 56 to maintain the interior of the chamber 1 at a predetermined depressurized state, and the temperature of the susceptor 2 is controlled to a predetermined temperature by the heater 31.

Then, while maintaining the state in which the $N_2$ gas is continuously supplied, the opening/closing valves 71, 72, and 72*a* are operated to sequentially supply $TiCl_4$ gas, which is a raw material gas, and $NH_3$ gas, which is a nitride gas (reducing gas), so that a TiN film, which is a metal-based film, is formed on the wafer W through an ALD method. For example, as illustrated in FIG. 5, a TiN film 303 is formed on the patterned $SiO_2$ film 302 of the wafer W.

At this time, the temperature of the susceptor 2 is preferably set to 200 to 600 degrees C., and the pressure within the chamber 1 is preferably set to 266.6 to 13,332.2 Pa (2 to 100 Torr).

After film formation, the opening/closing valves 71, 72, and 72*a* are closed, the supply of $TiCl_4$ gas and $NH_3$ gas is stopped, and the interior of the chamber 1 is purged with $N_2$ gas.

Thereafter, in the state in which the wafer W after film formation is still placed on the susceptor 2, the opening/closing valve 73 is opened to supply DCS gas, which is a Si-containing gas, into the chamber 1, which is a processing container. At this time, $N_2$ gas as a carrier gas is supplied from at least the third $N_2$ gas source 56.

By performing the Si-containing gas supply step which is a post-film-formation process in this way, DCS gas, which is a Si-containing gas, is adsorbed on the surface of the TiN film formed on the wafer W, and as illustrated in FIG. 6, a Si-containing layer is formed as a surface layer 304 on the surface of the TiN film 303 formed on the wafer W. The Si-containing layer constituting the surface layer 304 may be a Si layer formed by heating a Si-containing gas or may a layer that includes, in Si, TiSiN formed by the reaction of Si and TiN.

As the conditions when supplying the DCS gas, the temperature of the susceptor 2 is preferably set to 400 to 600 degrees C., and the pressure within the chamber 1 is preferably set to 266.6 to 13,332.2 Pa (2 to 100 Torr). Conditions similar to this may be used for other Si-containing gases. The temperature of the susceptor is preferably the same as the temperature when forming the TiN film, from the viewpoint of not lowering a throughput.

As described above, since the Si-containing gas forms the surface layer 304 by being adsorbed on the surface of the TiN film 303 formed on the wafer W, the wafer W is carried out in a state in which the surface of the TiN film 303 is not exposed. Therefore, even if the wafer W is exposed to the atmosphere, the oxidation of the TiN film 303 is suppressed, and thus it is possible to prevent the resistance of the TiN film 303 from increasing. In particular, when the film thickness of the TiN film 303 is reduced to 5 nm or less, the influence of oxidation increases. Thus, the oxidation suppression effect by the supply of DCS gas, which is a Si-containing gas, becomes higher.

The supply of Si-containing gas may be performed once or repeated multiple times. When the supply of the Si-containing gas is performed once, it is possible to control the adsorption amount by the supply time. In this case, the supply time of the Si-containing gas, such as DCS gas or $SiH_4$ gas, is preferably 1 to 20 sec. In addition, by repeating the supply of Si-containing gas, DCS gas, $SiH_4$ gas, or the like multiple times, it is possible to control the adsorption amount of DCS gas, $SiH_4$ gas, or the like by the number of times of repetition, and thus it is possible to enhance the controllability of the thickness of the surface layer 304. Therefore, it is possible further lower the resistance of the TiN film. In this case, the supply time of DCS gas, $SiH_4$ gas, or the like at one time is preferably in the range of 0.05 to 4 sec, and the number of times of supply (number of cycles) of DCS gas, $SiH_4$ gas, or the like is preferably in the range of 1 to 5 times. The same is also applicable to the case in which another Si-containing gas is used. When the supply of the Si-containing gas is repeated multiple times, it is preferable to purge the interior of the chamber 1 with $N_2$ gas between the cycles of supplying of the Si-containing gas.

Figure 7:
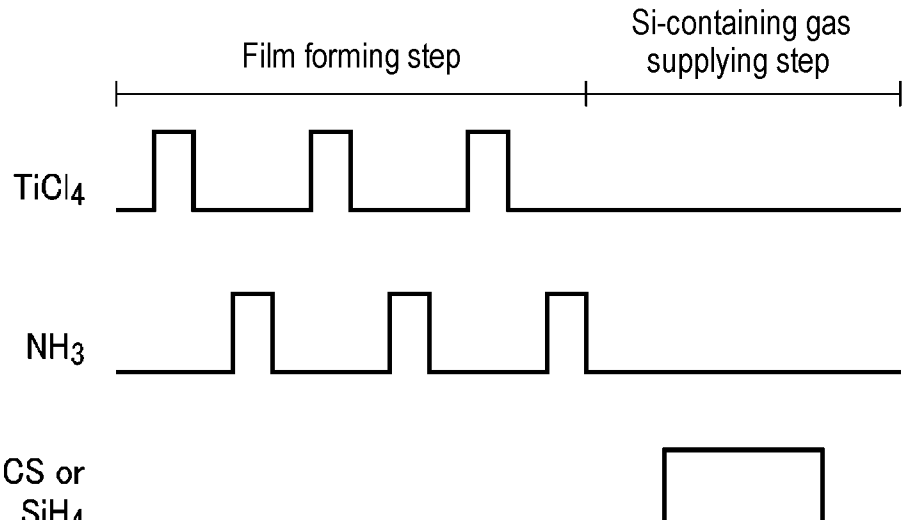
FIG. 7 is a timing chart illustrating a specific gas supply sequence of a TiN film forming step and a Si-containing gas supply step in a case in which $SiH_4$ gas is supplied once (1 cycle) as a Si-containing gas.
Figure 8:
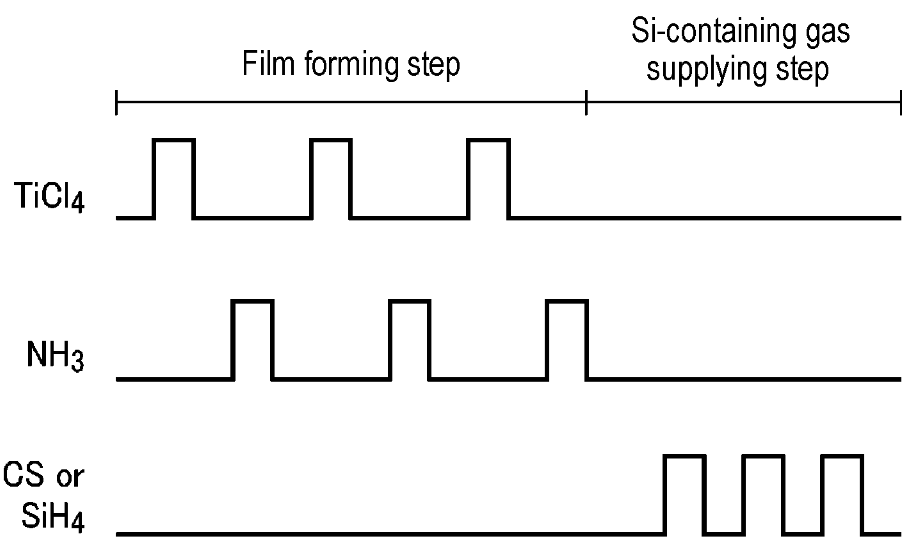
FIG. 8 is a timing chart illustrating a specific gas supply sequence of a TiN film forming step and a Si-containing gas supply step in a case in which $SiH_4$ gas is supplied multiple times (multiple cycles) as a Si-containing gas.

The specific gas supply sequence of the TiN film forming step and the Si-containing gas supply step in this case is illustrated, for example, in FIGS. 7 and 8. Here, the case in which DCS gas or $SiH_4$ gas is used as the Si-containing gas is shown. FIG. 7 is a timing chart when DCS gas or $SiH_4$ gas as the Si-containing gas is supplied once (1 cycle), and FIG. 8 is a timing chart when DCS gas or $SiH_4$ gas is supplied multiple times (multiple cycles).

Figures 9, 10:
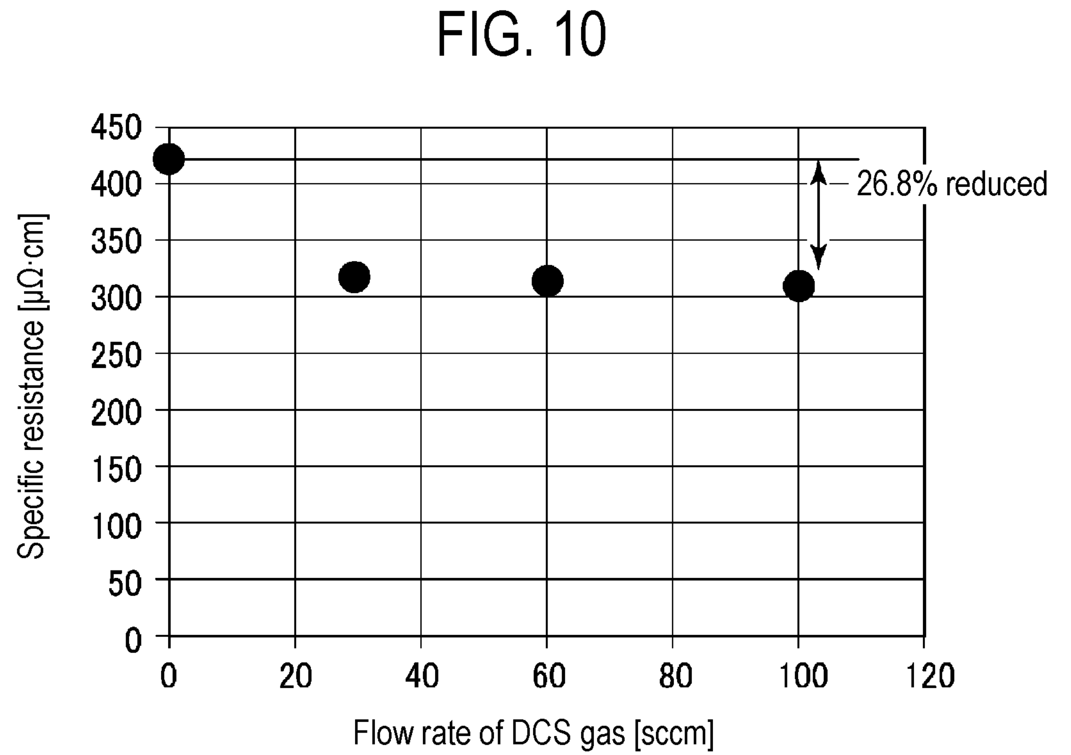
FIG. 9 is a specific gas supply sequence of a TiN film forming step and a Si-containing gas supply step in a case in which $SiH_4$ gas and $NH_3$ gas are alternately supplied multiple times.
FIG. 10 is a diagram showing the relationship between a flow rate of DCS gas and a specific resistance of a TiN film.

$NH_3$ gas may be supplied during the Si-containing gas supply step, which is the post-film formation process. In this case, $NH_3$ gas may be supplied after supplying the DCS gas or the $SiH_4$ gas as the Si-containing gas, or the DCS gas or the $SiH_4$ gas and the $NH_3$ gas may be alternately supplied multiple times. By supplying the DCS gas or the $SiH_4$ gas and the $NH_3$ gas, it is possible to form a SiN layer as the surface layer 304. By supplying these gases alternately multiple times, it is possible to further enhance the uniformity of the film thickness. The specific gas supply sequence of the TiN film forming step and the Si-containing gas supply step in this case is, for example, illustrated in the timing chart of FIG. 9. FIG. 9 illustrates an example in which, after the film forming step is completed, the supply of $TiCl_4$ gas is stopped, purging is performed, and then $NH_3$ gas and DCS gas or $SiH_4$ gas are alternately supplied multiple times.

After the step of supplying the Si-containing gas, the opening/closing valve 73 is closed to stop the supply of DCS gas, which is a Si-containing gas, and the interior of the chamber 1 is purged with $N_2$ gas. Next, the gate valve 27 is opened, and the wafer W is carried out through the carry-in/out port 26.

Figures 11, 12:
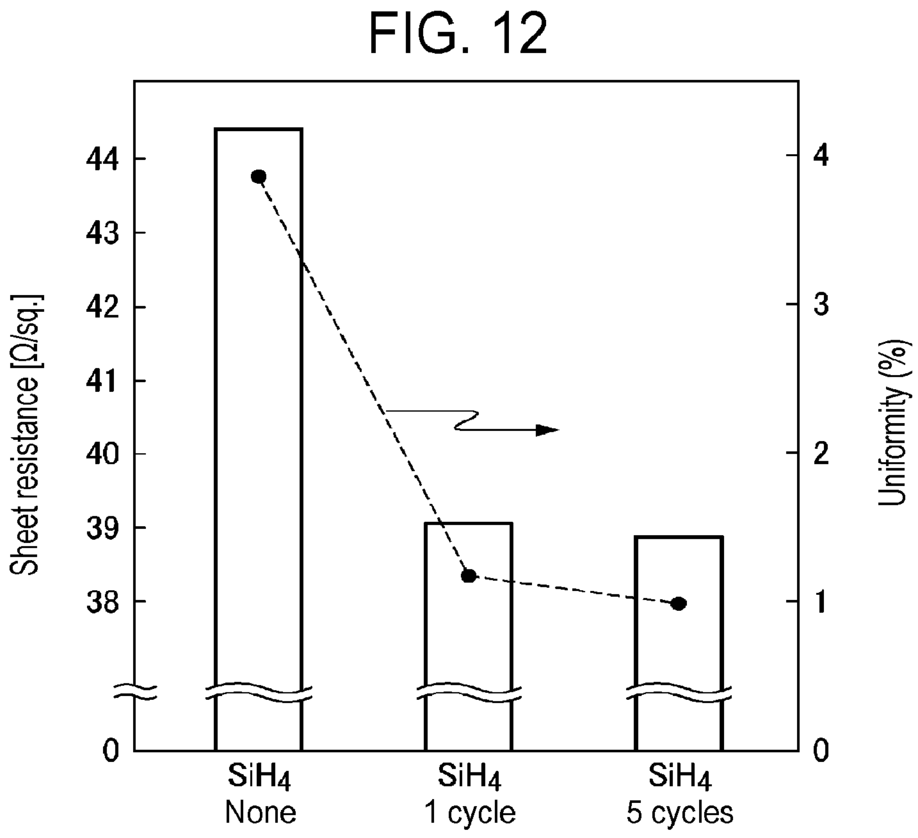
FIG. 11 is a diagram showing the relationship between a supply time of DCS gas and a specific resistance of a TiN film.
FIG. 12 is diagram showing the results of measuring sheet resistances of TiN films and the uniformities thereof in a case in which supply of $SiH_4$ gas as a Si-containing gas supply step is performed for one cycle, a case in which supply of $SiH_4$ gas is performed for five cycles with purging interposed between cycles, and a case in which supply of $SiH_4$ gas is not performed after forming a TiN film.

Regarding a case in which the Si-containing gas supply step was not actually performed after forming a TiN film having a thickness of 3 to 5 nm through an ALD method, and a case in which the supply of DCS gas was performed as the Si-containing gas supply step under various conditions, changes in resistivity after being left in the atmosphere were investigated. FIG. 10 is a diagram showing the relationship between the flow rate of DCS gas and the specific resistance of a TiN film, and FIG. 11 is a diagram showing the relationship between the supply time of DCS gas and the specific resistance of a TiN film. The temperature of the DCS gas supply step was set to the range of 450 to 500 degrees C., the pressure was set to the range of 266.6 to 1,199.9 Pa (2 to 9 Torr), and FIG. 10 shows the case in which the supply time of DCS gas was 0.05 sec, and FIG. 11 shows the case in which the flow rate of DCS gas was 30 sccm. As shown in these figures, by performing the Si-containing gas supply step, the specific resistance (μΩ·cm) after being left in the atmosphere was reduced. Thus, the effect of suppressing the surface oxidation of the TiN film by the DCS gas supply step was confirmed. It was confirmed that the specific resistance decreases as the flow rate of DCS gas increases and the supply time of DCS gas increases. Specifically, it was confirmed that when the flow rate was set to 100 sccm, the specific resistance was reduced by 26.8%, and when the time was set to 10 sec, the specific resistance was reduced by 37.8%.

Next, regarding a case in which, as the Si-containing gas supply step, the supply of $SiH_4$ gas was performed once (1 cycle) and a case in which the supply of $SiH_4$ gas was performed 5 times (5 cycles) with purging interposed between cycles, the sheet resistances (Ω/sq.) of TiN films after being left in the atmosphere were measured. For comparison, the sheet resistances were also measured regarding a case in which the supply of $SiH_4$ gas was not performed after the formation of the TiN film. Here, the supply time and flow rate of $SiH_4$ gas per one time supply were set to 0.05 sec and 50 sccm, respectively, the temperature in the Si-containing gas supply step was set to the range of 450 to 700 degrees C., and the pressure was set to 266.6 to 1,199.9 Pa (2 to 9 Torr). The sheet resistances of the TiN films and the uniformities thereof at that time are shown in FIG. 12.

As shown in FIG. 12, when the Si-containing gas supply step was not performed, the average value of sheet resistances was 44.4 Ω/sq. and the uniformity was 3.9%, whereas, when the number of times (cycles) of supplying $SiH_4$ gas was one (1 cycle), the average value of sheet resistances was 39.1 Ω/sq. and the uniformity was 1.2%, and when the number of times (cycles) of supplying $SiH_4$ gas was five (5 cycles), the average value of sheet resistances was 38.9 Ω/sq. and the uniformity was 1.0%. That is, the specific resistance and the uniformity thereof were improved by performing the supply of $SiH_4$ gas, and the specific resistance and the uniformity thereof were further improved by supplying $SiH_4$ gas multiple times.

Figures 13, 14:
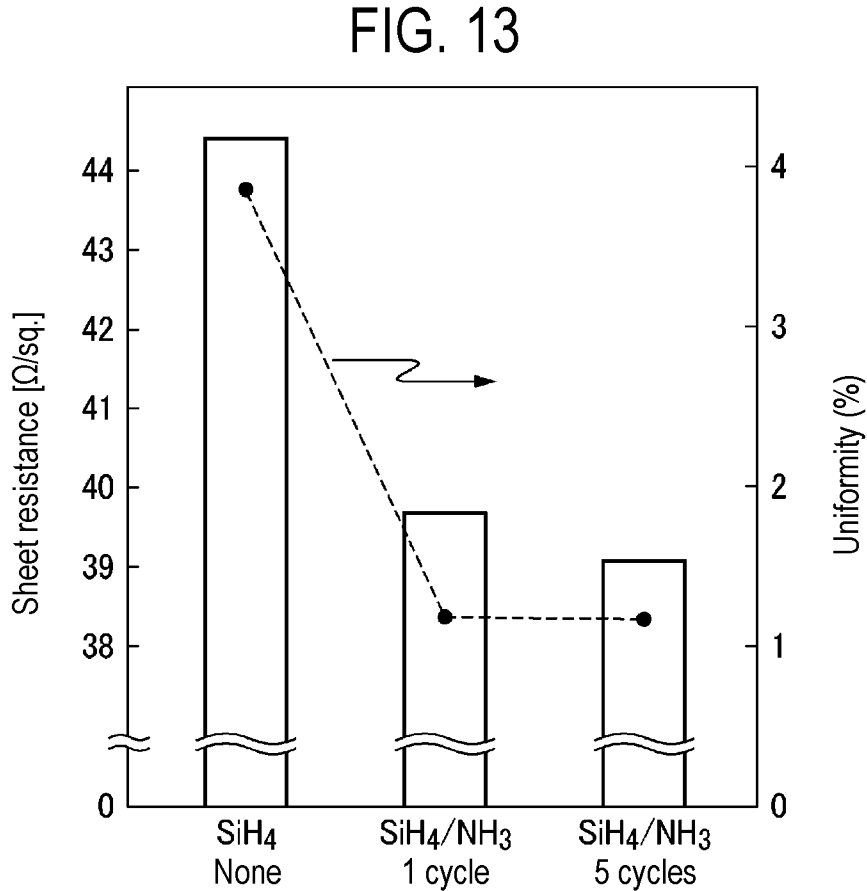
FIG. 13 is diagram showing the results of measuring sheet resistances of TiN films and the uniformities thereof in a case in which supply of $SiH_4$ gas as a Si-containing gas supply step and supply of $NH_3$ gas are performed for one cycle, a case in which supply of $SiH_4$ gas and supply of $NH_3$ gas are performed for five cycles, and a case in which supply of $SiH_4$ gas is not performed after forming a TiN film.
FIG. 14 is a cross-sectional view illustrating a state in which a SiGe film is formed after a surface layer is formed on the surface of a TiN film.

Next, regarding a case in which, as the Si-containing gas supply step, each of $SiH_4$ gas and $NH_3$ gas was supplied one time (1 cycle), and a case in which $SiH_4$ gas and $NH_3$ gas were alternately supplied 5 times (5 cycles) with purging interposed between cycles, the sheet resistances (Ω/sq.) of TiN films after being left in the atmosphere were measured. Here, the supply time and flow rate of $SiH_4$ gas per one time were set to 0.05 sec and 50 sccm, respectively, and the supply time and flow rate of $NH_3$ gas per one time were set to 0.05 sec and 600 sccm, respectively. The temperature of the Si-containing gas supply step was set to the range of 450 to 700 degrees C., and the pressure was set to the range of 266.6 to 1,199.9 Pa (2 to 9 Torr). The sheet resistances of the TiN films and the uniformities thereof at that time are shown in FIG. 13. FIG. 13 also shows the results when the Si-containing gas supply step of FIG. 12 was not performed.

As shown in FIG. 13, the average value of sheet resistances when the Si-containing gas supply step was not performed was 44.4 Ω/sq. and the uniformity thereof was 3.9%, whereas, when the number of times of supplying $SiH_4$ gas and $NH_3$ gas was one, the average value of sheet resistances was 39.7 Ω/sq. and the uniformity thereof was 1.2%, and when the number of times of supplying $SiH_4$ gas and $NH_3$ gas was five, the average value of sheet resistances was 39.1 Ω/sq. and the uniformity thereof was 1.2%. That is, the sheet resistance and the uniformity thereof were improved by performing the supply of $SiH_4$ gas and $NH_3$ gas, and the sheet resistance was further improved by supplying $SiH_4$ gas and $NH_3$ gas multiple times.

After supplying the Si-containing gas to form the surface layer 304 of the TiN film 303, the wafer W is taken out into the atmosphere, and then, as illustrated in FIG. 14, a film forming process in the next step, for example, formation of a SiGe film 305, is performed in another film forming apparatus. Then, after the necessary post-processing is performed, a desired semiconductor device is obtained. At this time, since the surface layer 304 containing Si is formed on the surface of the TiN film 303 by the supply of the Si-containing gas, the oxidation of the TiN film 303 is suppressed and the specific resistance is maintained low. Therefore, a good device characteristic is obtained.

Since the film formed in the next step is the SiGe film 305, which is a Si-containing layer, the film has a high affinity with respect to the Si-containing surface layer 304 formed for suppressing oxidation. In addition, since the formation of the SiGe film in the next step is performed on the surface layer 304 containing Si in this way, effects such as shortening of incubation time are obtained when the SiGe film is formed through a general CVD method.

OTHER APPLICATIONS

Although embodiments have been described above, it should be considered that the embodiments disclosed herein are exemplary in all respect and are not restrictive. The embodiments described above may be omitted, replaced, or modified in various forms without departing from the scope and spirit of the appended claims.

For example, the above-described embodiments have been described mainly with reference to the case in which a TiN film is formed as a metal-based film through an ALD method, but as described above, the present disclosure is applicable to a metal film and a metal compound film as long as the films have characteristics that may be deteriorated by oxidation. Furthermore, the film forming method is not limited to the ALD method.

As the film forming apparatus of FIG. 3, an apparatus for ALD film formation of a TiN film has been exemplified, but the film forming apparatus of FIG. 3 may also be applicable to film formation of other metal-based films. The film forming apparatus illustrated in FIG. 3 is merely an example and may be any film forming apparatus, such as a CVD film forming apparatus or a PVD film forming apparatus, as long as a film forming process and supply of a Si-containing gas into the processing container (chamber) can be performed. Although the film forming apparatus of FIG. 3 is a single-wafer type, the film forming apparatus may be a batch type film forming apparatus that forms a film on a plurality of substrates at once, such as a vertical type apparatus. In addition, the film forming apparatus may be a semi-batch type film forming apparatus in which a plurality of substrates are placed on a stage to perform a film forming process.

Furthermore, in the embodiments described above, a semiconductor wafer has been described as an example of a substrate, but the substrate is not limited to the semiconductor wafer, and may be another substrate, such as a glass substrate used for a flat panel display (FPD) or a ceramic substrate.

EXPLANATION OF REFERENCE NUMERALS

1: chamber, 2: susceptor, 3: shower head, 4: exhaust part, 5: gas supply mechanism, 6: controller, 51: $TiCl_4$ gas source, 52: $NH_3$ gas source, 53: DCS gas source, 54, 55, 56: $N_2$ gas supply source, 100: film forming apparatus, 201: substrate, 202: metal-based film, 203: surface layer, 301: Si base body, 302; $SiO_2$ film, 303: TiN film, 304: surface layer, W: semiconductor wafer (substrate)

What is claimed is:

1. A film forming method comprising:

providing a substrate into a processing container;

forming a metal-based film on the substrate within the processing container; and subsequently, forming a surface layer containing Si on a surface of the metal-based film by supplying a Si-containing gas into the processing container in which the substrate is provided such that the Si-containing gas is adsorbed on the surface of the metal-based film, so as to suppress oxidation of the metal-based film when the substrate is carried out of the processing container, wherein the surface layer includes a TiSiN film and is in a range of 0.5 to 1 nm in thickness.

2. The film forming method of claim 1, wherein the substrate has temperature in a range of 400 to 600 degrees C. when performing the forming the surface layer containing Si.

3. The film forming method of claim 1, wherein the Si-containing gas is at least one of a silane-based compound, a chlorosilane-based compound, and an organic silane-based compound.

4. The film forming method of claim 3, wherein the Si-containing gas is at least one of dichlorosilane, silane, and disilane.

5. The film forming method of claim 1, wherein, in the forming the surface layer containing Si, the Si-containing gas is supplied multiple times.

6. The film forming method of claim 1, wherein, in the forming the surface layer containing Si, the Si-containing gas and a reaction gas that reacts with the Si-containing gas are supplied.

7. The film forming method of claim 6, wherein, in the forming the surface layer containing Si, the Si-containing gas and the reaction gas are alternately supplied multiple times.

8. The film forming method of claim 1, wherein the forming the metal-based film is performed through any of an ALD method, a CVD method, and a PVD method.

9. The film forming method of claim 1, wherein the metal-based film is any of the Ti film, the TiN film, a Ta film, a TaN film, a W film, an Al film, a Mo film, a Ru film, a Co film, and a Ni film.

10. The film forming method of claim 1, wherein the metal-based film is the TIN film, and the forming the metal-based film is performed through an ALD method.

11. The film forming method of claim 10, wherein the Si-containing gas is dichlorosilane.

12. The film forming method of claim 10, wherein, in the forming the surface layer containing Si, the Si-containing gas is supplied multiple times.

13. The film forming method of claim 10, wherein formation of the TiN film is performed using a Ti-containing gas and $NH_3$ gas, and in the forming the surface layer containing Si, the Si-containing gas and the $NH_3$ gas are supplied.

14. The film forming method of claim 13, wherein, in the forming the surface layer containing Si, the Si-containing gas and the $NH_3$ gas are alternately supplied multiple times.

15. The film forming method of claim 10, wherein the substrate includes a patterned $SiO_2$ film formed on a semiconductor based body.

* * * * *